United States Patent [19]

Enloe et al.

[11] Patent Number: 5,028,650
[45] Date of Patent: Jul. 2, 1991

[54] BORON NITRIDE SHEETS

[75] Inventors: Jack H. Enloe, Columbia; John W. Lau, Gaithersburg; Christian B. Lundsager, Ashton, all of Md.

[73] Assignee: W. R. Grace & Co.-Conn., New York, N.Y.

[21] Appl. No.: 501,344

[22] Filed: Mar. 22, 1990

Related U.S. Application Data

[63] Continuation-in-part of Ser. No. 321,928, Mar. 10, 1989, abandoned, which is a continuation-in-part of Ser. No. 148,829, Jan. 27, 1988, Pat. No. 4,920,640.

[51] Int. Cl.$^5$ ............................................. C08K 3/38
[52] U.S. Cl. .................................. 524/404; 524/586; 106/287.3; 501/96
[58] Field of Search ............... 106/287.3; 501/96; 524/404, 586

[56] References Cited

U.S. PATENT DOCUMENTS

| | | | |
|---|---|---|---|
| 3,189,978 | 6/1965 | Stetson | 29/155.5 |
| 3,261,800 | 7/1966 | Collins | 524/404 |
| 3,755,204 | 8/1973 | Sergeys | 252/455 R |
| 4,144,207 | 3/1979 | Ehnsong | 524/404 |
| 4,518,716 | 5/1985 | John | 524/404 |
| 4,518,736 | 5/1985 | Jahn | 524/404 |
| 4,542,072 | 9/1985 | Hsieh | 428/446 |
| 4,571,414 | 2/1986 | Renlund et al. | 501/96 |

FOREIGN PATENT DOCUMENTS

| | | |
|---|---|---|
| 9099703 | 9/1974 | Japan . |
| 7024526 | 7/1980 | Japan . |
| 7100791 | 6/1982 | Japan . |
| 9088816 | 5/1984 | Japan . |
| 6110074 | 6/1984 | Japan . |
| 0118676 | 6/1985 | Japan . |
| 2100479 | 10/1985 | Japan . |
| 1091069 | 5/1986 | Japan . |
| 1168564 | 7/1986 | Japan . |
| 1186257 | 8/1986 | Japan . |
| 682477 | 9/1979 | U.S.S.R. . |

*Primary Examiner*—Joseph L. Schofer
*Assistant Examiner*—Mark D. Sweet
*Attorney, Agent, or Firm*—Steven Capella

[57] ABSTRACT

Boron nitride green sheets are made of boron nitride powder in an organic binder which leaves no undesirable residue upon pyrolysis in the absence of oxygen. These boron nitride green sheets can be placed on each side of the ceramic green sheet to form a composite for hot pressing ceramic green sheets containing ceramic powder to produce dense ceramic sheets suitable for electronic substrates.

1 Claim, 1 Drawing Sheet

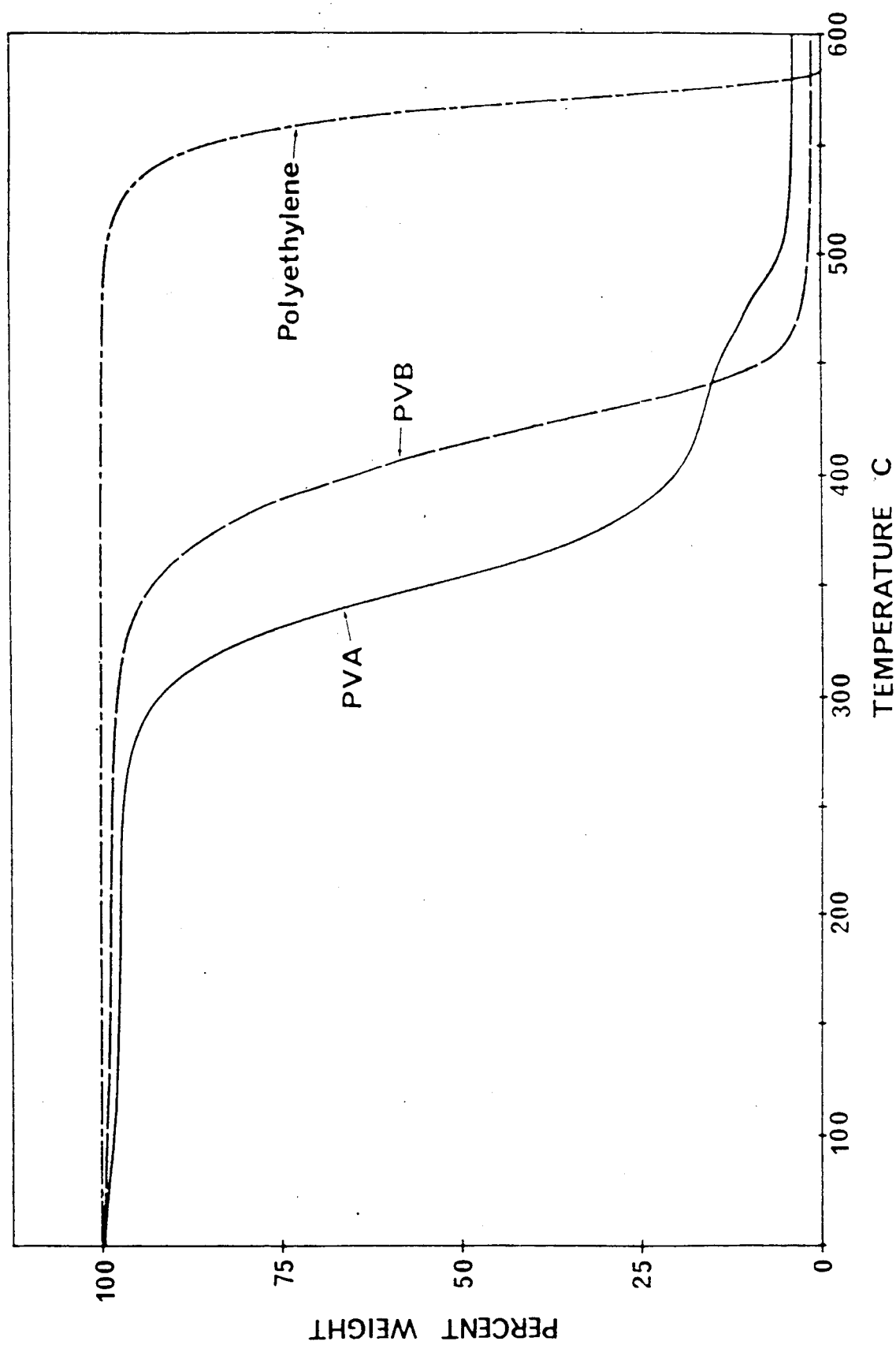

BORON NITRIDE SHEETS

CROSS-REFERENCE TO RELATED APPLICATION

This application is a continuation-in-part of U.S. patent application Ser. No. 321,928, filed Mar. 10, 1989, now abandoned, which is a continuation-in-part of U.S. patent application Ser. No. 148,829, filed Jan. 27, 1988, now U.S. Pat. No. 4,920,640.

BACKGROUND AND PRIOR ART

When hot pressing ceramic green sheets, the binders for the green sheets must impart strength (and handleability) to the green ceramic sheet. In addition, a successful organic binder system must meet the requirement that it can be removed during heating such that no undesirable properties result from residues (e.g. carbon) which would be left in the ceramic after densification. This attribute of a binder is commonly referred to as "clean-burning" even if the binder removal does not involve oxidation. Note that the property of clean-burning is dependent upon the environmental conditions during firing. For instance, if conventional sintering is performed in air, the binder removal is assisted by the presence of oxygen, which provides the potential for oxidation of carboneous residues from thermal decomposition. Clean-burning of the binder becomes more difficult to achieve when sintering under non-oxidizing or reducing conditions, where oxidation is effectively eliminated. Hot pressing with graphite tooling (in non-oxidizing atmospheres) exacerbates the binder removal problem, since the graphite will compete with the binder residues for any oxygen in the atmosphere. Hence, the benefits from adding small quantities of oxygen or water vapor to facilitate binder removal (as is sometimes done through the addition of water vapor) is minimized. The problem of binder removal is further exacerbated during hot pressing by the fact that the green body is enclosed by the tooling, thus requiring the binder volatiles to escape through the crack between the rams and the die. Hence, there are long diffusion paths through the green compact for the binder volatiles. There is also little chance for control of the local atmosphere in this encapsulated system. From consideration of the remarks above, it is concluded that hot pressing places more constraints on the successful binder system than conventional sintering, and thus eliminates from consideration some organics which are considered to be clean-burning when employed for conventional sintering processes.

Another common problem to be overcome in hot pressing of ceramics is sticking of the ceramic to the graphite tooling after densification. Boron nitride (BN) powder is often used as an effective release agent for hot pressing ceramics with graphite tooling. It is commonly applied to the graphite surfaces (which would contact with ceramic powder) by painting or spraying a BN-containing slurry (e.g. U.S. Pat. No. 4,518,736). BN powder is useful because it does not readily react with either graphite nor many refractory ceramics and does not readily densify itself. This, coupled with its plate-like particle morphology, allows easy delamination of the ceramic from the graphite after hot pressing.

If a thicker BN layer is necessary (because of slight reactions between the BN and other materials or because of the need for a better barrier to carbon diffusion into the ceramic), BN powder can be formed into a green sheet using the same procedures as described previously for making green ceramic sheets. The binder system used for making the BN green sheet must meet the same criteria of strength and clean-burning nature as mentioned above for the ceramic green sheets. In Japanese Published Patent Application 61-10074 to Sadakata a boron nitride mold releasing sheet material is used for SiC hot press sintering. The sheet material has a binder containing thermoplastic resins as its major component such as polyvinyl butyral (PVB) or polyvinyl alcohol (PVA) and a plasticizer such as butyl butylphthalylacrylate or polyethylene glycol and peptidizer such as glycerin or octadecylamine. In order for the sheet to maintain a required strength and flexibility the approximate range of the composition is given as 82–88 weight % of the mold-releasing material, 8–12 weight % of the binder, 4–6 weight % of the plasticizer, and less than 5 weight % of the peptidizing agent. For some applications, the PVB and PVA binders suggested by this Japanese patent may not be effective since they leave substantial residue upon pyrolysis in non-oxidizing atmospheres (see Figure). Residues from these binders could migrate to the material to be hot pressed and affect its resultant properties.

OBJECTS OF THE INVENTION

It is an object of this invention to provide an improved boron nitride green sheet suitable for hot pressing.

It is a further object of this invention to provide an improved method for producing a boron nitride green sheet which is suitable for hot pressing.

It is a further object of this invention to provide a binder system a boron nitride green sheet which leaves no undesirable residues upon pyrolysis in the absence of oxygen such that the green sheet can be used for producing electronic substrates by hot pressing.

These and further objects will become apparent as the description of the invention proceeds.

SUMMARY OF THE INVENTION

The present invention is directed to boron nitride green sheets made of boron nitride (BN) powder or particulates and an organic binder which leaves no undesirable carbonaceous residue upon pyrolysis in the absence of oxygen and the method of making this sheet. The preferred organic binder is polyethylene.

A preferred process to make the boron nitride green sheet involves mixing boron nitride powder, an organic binder which leaves no undesirable carbonaceous residue upon pyrolysis in the absence of oxygen, and oil. The mixture is compounded at an elevated temperature and molded to form sheets by extrusion through a die. The oil is removed by extraction with an organic solvent. Again the preferred organic binder is polyethylene.

These sheets and the method of making are described in parent application U.S. Ser. No. 148,829, filed Jan. 27, 1988 and the entire contents of that application are incorporated herein by reference. This referenced application describes the use of these boron nitride sheets to be placed on each side of the ceramic green sheet to form a composite. The composite is hot pressed under conditions which facilitate binder removal and densify the ceramic. Finally the BN layers on each side of the dense ceramic sheet are removed.

BRIEF DESCRIPTION OF THE DRAWING

The Figure is a thermogravimetric analysis of organic binders during heating in the absence of oxygen.

DESCRIPTION OF PREFERRED EMBODIMENTS

The organic binder which is used for the boron nitride green sheet should leave no undesirable residue upon pyrolysis prior to the densification of the ceramic powder. This requirement is dictated by the fact that such residues (i.e., carbon) can have harmful effects on both the physical and electronic properties of the ceramic. For example, U.S. Pat. No. 4,642,148 shows data indicating a substantial drop in the dielectric breakdown voltage in a ceramic circuit board when residual carbon levels were greater than 100 ppm. Since it is desirable to carry out the hot pressing in a non-oxidizing atmosphere (either to prevent oxidation of a non-oxide ceramic powder or the graphite tooling), it may be necessary that the binder pyrolysis be carried out in the absence of oxygen. This places a more stringent condition on the binder system since oxidation is effectively eliminated as a means of removing residues of pyrolysis. A binder candidate meeting this criteria is high-density polyethylene. For example, U. S. Pat. No. 3,755,204 describes a method for making porous ceramic supports where a step involves molding ceramic preforms using high-density polyethylene as the binder and oil as the plasticizer. The mixture can be compounded at an elevated temperature to facilitate melting of the polymer binder and then the compounded mixture can be formed into sheets by processes such as extrusion through a die or by pressing the compounded mixture into flat sheets. In either case, it is preferable to have the compounded mixture at an elevated temperature to improve the flow properties of the mixture. The oil can be removed from this system after formation of the sheets and before hot pressing by extraction with a suitable solvent such as trichloroethane. The extraction step reduces the total amount of organics to be removed during hot pressing and eliminates all but the very clean-burning polyethylene.

The Figure shows data depicting the clean-burning nature of polyethylene in the absence of oxygen. Data from thermogravimetric analysis of organic binders in argon/3% hydrogen for two commonly used organic binders, polyvinyl alcohol (PVA) and polyvinyl butyral (PVB). Above 600° C. there was no measurable residue for polyethylene, whereas the PVA and PVB left 4.0 and 1.4 weight percent, respectively. It is also noted from the Figure that polyethylene evolves over a narrow temperature range as compared to the other two binders. This is indicative of rapid gaseous evolution, which is not desirable for sintering since it would tend to disrupt the green microstructure and, hence lower the fired density. However, for hot pressing, rapid evolution of the binders can be tolerated since the green body is constrained by the tooling and pressure can be applied to maintain or recover intimate contact between the particles. In fact, rapid evolution may be desired since it allows for faster processing cycles.

To reduce interactions between the graphite tooling and the ceramic being processed, a layer of material with reduced reactivity can be introduced at the graphite/ceramic interface. Such a material is boron nitride.

BN sheet is produced using BN powder and an organic binder which also leaves no undesirable residue upon pyrolysis. BN remains inert (i.e., does not sinter or interact with the substrate material) under conditions necessary to hot press most ceramic powders. Hence, it is used to isolate the ceramic material from the graphite and to delaminate sheets of substrate material from the hot press tooling after processing, or in the case of simultaneous processing of ceramic sheets, to serve as a delaminant layer between sheets of substrate material. The BN also provides a non-reactive barrier to prevent contamination of the substrate material by the tooling (e.g., carbon). In this respect, it provides an improvement over the conventional technique of using thin graphite sheet as a delaminant layer. It has also been found that the use of BN tape results in a smoother surface on the fired ceramic sheet as compared with graphite foil. This minimizes or eliminates the need for surface machining of the ceramic sheet after the hot pressing step.

Polyethylene represents a successful binder for the BN sheet because its clean-burning nature eliminates the potential problem of reaction between carboneous residues and the ceramic at the ceramic-BN interface. In this respect, use of polyethylene as the binder in BN tape represents an improvement over the art described by Japanese Patent No. 61-10074 to Sadakata where PVA and PVB are recommended binders. As discussed above, PVA and PVB leave significant residues upon pyrolysis in the absence of oxygen. The BN sheet can be fabricated using polyethylene and oil as described previously for the ceramic sheet to be hot pressed.

The desired binder content in the BN tape is the minimum concentration that binds the BN particulates together, thereby producing a tape of good structural integrity which can be handled for subsequent processing such as punching and cutting. This minimum allowable concentration will vary depending on factors such as binder chemistry, BN particle size and morphology and sheet forming technique. For the BN sheet with polyethylene binder cited above, it has been found that about 10 wt % polyethylene is sufficient to produce a handleable BN sheet, although optimum binder contents ranging from 5 to 20 wt % are possible depending on the factors cited above. Excessive binder content can lead to problems including: (1) excessive material flow into the die cracks as the binder becomes more fluid during heat-up, (2) more disruption of the green body being consolidated because of excessive volume change in the BN layer upon removal of the binder, and (3) problems associated with removal of excessive amounts of binder from the hot pressing unit (e.g. contamination of vacuum pumps, insulation, seals, etc.).

To produce a single sheet of ceramic substrate, the BN sheet made according to this invention can be laminated to both sides of the ceramic green sheet and hot pressing is carried out under conditions necessary to first remove the binder and finally to densify the ceramic. It is not necessary to laminate the BN sheet to the ceramic green sheet. The BN sheets could just be placed on either side of the ceramic green sheet. The advantage of laminating is that it prevents further contamination of the ceramic green sheet as it is being handled. Simultaneous hot pressing of several layers to reduce manufacturing costs can be carried out by placing rigid spacers of the tooling material between the laminant structures described above such that several unit cells of the form (BN-ceramic sheet-BN-rigid spacer) are stacked upon one another in the hot press. Alternatively, unit cells of the form (BN sheet-ceramic sheet-(BN sheet-ceramic sheet)$_x$-rigid spacer) (where x is a positive integer) can be built up to further improve the economics of the process. In this build up procedure, either a BN sheet is laminated to just one side of a ceramic sheet or else the stack is made by just alternatively adding a BN sheet and a ceramic sheet.

After hot pressing, the substrate sheets can be easily separated from the graphite tooling and/or each other. The BN on the surface of the dense ceramic sheets can be subsequently removed by washing and/or grit-blasting.

This invention is further explained by way of an example.

EXAMPLE 1

This example illustrates the utility of the hot pressing technology to make a dense sheet of a hard-to-sinter compound (AlN) that is desirable for electronic substrate applications.

A formulation of high purity AlN powder with CaCO$_3$ additions, polyethylene and oil was prepared by blending the components in the weight percentages listed in Table 1 into a moldable compound at approximately 160° C. All other elemental impurities were less than 0.02%. Similarly, a BN formulation was compounded at approximately 160° C. in weight percentages listed in Table 1. The formulations were pressed at approximately 160° C. into flat sheets and cut to dimensions (3"×3") that would fit the graphite die to be used in hot pressing the preforms. The sheet thicknesses were approximately 0.040"for AlN and 0.030"for BN. The sheets were placed in a trichloroethane bath to extract the oil, pressed flat, and laminated at approximately 110° C. and less than 500 psi pressure to produce a preform stack of the form BN-AlN-BN. This stack was loaded into the graphite die and graphite rams were placed in contact with the BN layers. Key elements of the hot pressing cycle were: (1) a temperature hold at 600° C. under vacuum and no ram pressure to facilitate binder evolution, and (2) a maximum temperature of 1900° C. and 1,000 psi ram pressure in nitrogen to densify the AlN. After hot pressing, the stack was removed from the die and the BN was easily removed from the AlN surfaces by grit blasting.

The resultant AlN sheet was highly translucent, which signifies high purity, high density, little interaction with the graphite tooling and the clean-burning nature of the polyethylene binder. Surface roughness and warpage were measured to be 49 micro inches and 0.04%, respectively. Thermal conductivity was measured on a thicker specimen, made by the same process, and was determined to be 1.8 W/cm° K. The above properties show that good quality aluminum nitride substrates can be produced by this technique with surface finish that requires little or no machining.

TABLE 1

Composition of Preforms for Example 1

| Description | Preform Composition (weight %) | Component |
|---|---|---|
| AlN formulation | 68.0 | AlN Powder (Tokuyama Soda Grade F) |
| | 3.4 | CaCO$_3$ Powder |
| | 3.4 | Polyethylene |
| | 25.2 | Mineral Oil |
| BN formulation | 61.0 | BN Powder |
| | 6.0 | Polyethylene |
| | 33.0 | Mineral Oil |

It is understood that the foregoing detailed description is given merely by way of illustration and that many variations may be made therein without departing from the spirit of this invention.

What is claimed is:

1. A boron nitride green sheet consisting essentially of boron nitride particulates and a polyethylene binder, said green sheet having a binder concentration in the range from about 5 to 20 wt. % based on the weight of boron nitride present in the sheet.

* * * * *